United States Patent
Shibata et al.

(10) Patent No.: US 7,451,368 B2
(45) Date of Patent: Nov. 11, 2008

(54) SEMICONDUCTOR DEVICE AND METHOD FOR TESTING SEMICONDUCTOR DEVICE

(75) Inventors: Sigenori Shibata, Ichinomiya (JP); Sadao Yoshikawa, Yoro-gun (JP); Tomofumi Watanabe, Gifu-ken (JP); Takayuki Suzuki, Sakura (JP)

(73) Assignee: Sanyo Electric Co., Ltd., Osaka (JP)

( * ) Notice: Subject to any disclaimer, the term of this patent is extended or adjusted under 35 U.S.C. 154(b) by 840 days.

(21) Appl. No.: 10/951,398

(22) Filed: Sep. 28, 2004

(65) Prior Publication Data

US 2005/0068818 A1 Mar. 31, 2005

(30) Foreign Application Priority Data

Sep. 30, 2003 (JP) ............................. 2003-340192

(51) Int. Cl.
*G01R 31/28* (2006.01)
(52) U.S. Cl. .................. 714/724; 714/718; 714/729; 714/724
(58) Field of Classification Search ................ 714/724, 714/718, 719, 31, 729, 734, 742
See application file for complete search history.

(56) References Cited

U.S. PATENT DOCUMENTS 4,931,997 A * 6/1990 Mitsuishi et al. ....... 365/185.04
5,084,843 A * 1/1992 Mitsuishi et al. ............ 365/218
6,006,313 A * 12/1999 Fukumoto ................... 711/211
6,009,547 A * 12/1999 Jaquette et al. .............. 714/758
6,708,302 B1 * 3/2004 Shibayama et al. ......... 714/724
2003/0043612 A1 3/2003 Ishikawa

OTHER PUBLICATIONS

Patent Abstracts of Japan, Publication No. 2003-077296, Publication Date: Mar. 14, 2003, Title: "Semiconductor Device which Incorporates Memory Chip and Logic Chip, and in which Test of Memory Chip can be Performed".

* cited by examiner

*Primary Examiner*—Cynthia Britt
*Assistant Examiner*—Fritz Alphonse
(74) *Attorney, Agent, or Firm*—Occhiuti Rohlicek & Tsao LLP (57) ABSTRACT

A packaged semiconductor device that enables testing of semiconductor chips incorporated therein in a simplified and efficient manner. The semiconductor device includes a packaged logic chip for processing data and a packaged memory chip for storing data that is processed by or that is to be processed by the logic circuit. The semiconductor device has an automatic rewrite circuit and a selector. The automatic rewrite circuit automatically writes test data to the memory circuit in accordance with a command signal from a tester. The selector selectively switches between accessing of the memory circuit by the automatic rewrite circuit and accessing of the memory circuit by the logic circuit. The tester provides the automatic rewrite circuit with a test start command signal to start testing the logic circuit.

5 Claims, 6 Drawing Sheets

| Command Sequence | Bus Write Cycle | 1st Bus | | 2nd Bus | | 3rd Bus | | 4th Bus | | 5th Bus | | 6th Bus | |
|---|---|---|---|---|---|---|---|---|---|---|---|---|---|
| | | Address | Data | Address | Data | Address | Data | Address | Data | Address | Data | Address | Data |
| Read | 1 | XXXh | F0h | RA | RD | | | | | | | | |
| Read | 3 | 555h | AAh | 2AAh | 55h | 555h | F0h | RA | RD | | | | |
| Write | 4 | 555h | AAh | 2AAh | 55h | 555h | A0h | PA | PD | | | | |
| Delete Sector | 6 | 555h | AAh | 2AAh | 55h | 555h | 80h | 555h | AAh | 2AAh | 55h | SA | 30h |

Notes) Address/Data represented by hexadecimals
    XXXh represents arbritrary address
    Functions of 2types of read/reset commands are the same Abbreviations
RA:Read Address
RD:Read Output Address
PA:Write Address
PD:Write Data
SA:Sector Address

SEMICONDUCTOR DEVICE AND METHOD FOR TESTING SEMICONDUCTOR DEVICE

CROSS-REFERENCE TO RELATED APPLICATIONS

This application is based upon and claims the benefit of priority from prior Japanese Patent Application No. 2003-340192, filed on Sep. 30, 2004, the entire contents of which are incorporated herein by reference.

BACKGROUND OF THE INVENTION

The present invention relates to a semiconductor device in which a plurality of semiconductor chips are mounted in a single package, or to a so-called multi-chip package (MCP), and to a method for testing such a semiconductor device.

Japanese Laid-Open Patent Publication No. 2003-77296 describes a conventional semiconductor device. The semiconductor device is a single package including a logic chip (logic LSI) provided with a data processing function and a memory chip (memory LSI) for storing data that has been or will be processed by the logic chip. The logic chip includes a digital signal processor (DSP). The logic circuit processes predetermined data provided to the DSP and provides the processed data to the memory chip. The data is written to or stored in a memory circuit, such as a flash memory included in the memory chip. Further, the data processed by the logic circuit may be written beforehand to the memory circuit. A semiconductor device having such a configuration reduces the package cost.

Further, any combination of the LSIs mounted in the package may be selected. This reduces the risks and costs for developing a system LSI.

Before a packaged semiconductor device is shipped out of a factory, each chip is tested to determine that the chip is functioning properly. An MCP including a logic chip and a memory chip normally includes many terminal pins. Thus, a memory tester capable of testing only packages having a small number of terminal pins cannot be used to test an MCP. In this case, a logic tester capable of testing an MCP having many terminal pins is used. A typical logic tester generates test signals that are more complicated than those generated by a memory tester and makes determinations based on the test signals. However, although the logic tester may be applied to a package having many terminals pins, the number of packages that may be simultaneously tested is small. Further, when a memory chip in an MCP is an electrically rewritable non-volatile memory such as a flash memory, the time required to write data to the memory chip is long. Accordingly, the testing cost is high when conducting tests with a logic tester that can simultaneously test only a small number of packages.

SUMMARY OF THE INVENTION

One aspect of the present invention is a semiconductor device having a plurality of packaged semiconductor chips. The semiconductor chips include a logic chip, provided with a logic circuit for processing data, and a memory chip, provided with an electrically rewriteable non-volatile memory circuit for storing data that is processed by or that is to be processed by the logic circuit. An automatic rewrite circuit automatically writes test data to the memory circuit in accordance with a command signal from an external device. A switch circuit connected to the automatic rewrite circuit and the logic circuit switches between accessing of the memory circuit by the automatic rewrite circuit and accessing of the memory circuit by the logic circuit.

Another aspect of the present invention is a method for testing a semiconductor device having a plurality of packaged semiconductor chips. The semiconductor chips include a logic chip, provided with a logic circuit for processing data, and a memory chip, provided with an electrically rewriteable non-volatile memory circuit for storing data that is processed by or that is to be processed by the logic circuit. The semiconductor device includes an automatic rewrite circuit, for automatically writing test data to the memory circuit in accordance with a command signal from an external device, and a switch circuit, for switching between accessing of the memory circuit by the automatic rewrite circuit and accessing of the memory circuit by the logic circuit. The method includes automatically writing test data to the memory circuit with the automatic rewrite circuit, and testing the operation of the logic circuit with the external device, with the testing being performed in parallel to said automatically writing test data.

A further aspect of the present invention is a method for testing a semiconductor device having a plurality of packaged semiconductor chips. The semiconductor chips include a logic chip, provided with a logic circuit for processing data, and a memory chip, provided with an electrically rewriteable non-volatile memory circuit for storing data that is processed by or that is to be processed by the logic circuit. The method includes automatically writing test data to the memory circuit in accordance with a command signal from an external device by using an automatic rewrite circuit, and switching between accessing of the memory circuit by the automatic rewrite circuit and accessing of the memory circuit by the logic circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device and a method for testing the semiconductor device according to a first embodiment of the present invention will now be described.

Figure 1:
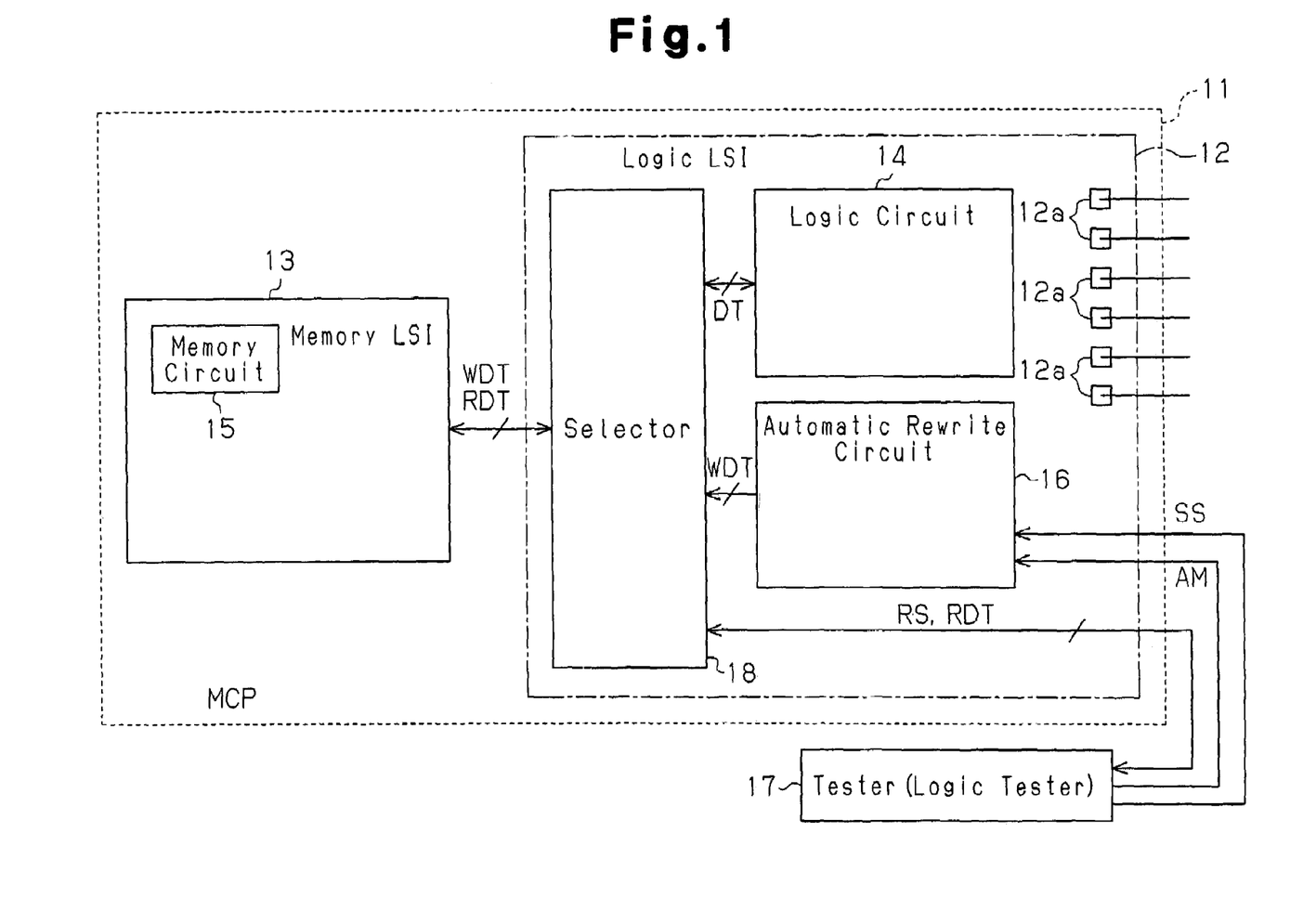
FIG. 1 is a schematic block diagram of a semiconductor device according to a first embodiment of the present invention.

Referring to FIG. 1, the semiconductor device 11 includes a plurality of semiconductor chips and is a so-called multi-chip package (MCP). The semiconductor chips mounted on the semiconductor device 11 includes a logic chip 12 (logic LSI), which is provided with a function for processing data, and a memory chip 13 (memory LSI), which stores the data processed by the logic chip 12 or data to be processed by the logic chip 12.

The logic chip 12 includes a logic circuit 14, such as a digital signal processor (DSP). The logic circuit 14 processes data provided through terminals 12a (only some are shown for the sake of convenience) of the logic chip 12. The processed data DT is normally provided to the memory chip 13 and written to a memory circuit 15, which is incorporated in the memory chip 13. Conversely, data DT that is pre-written to the memory circuit 15 is processed by the logic circuit 14 and output to external devices via the terminals 12a. In the present embodiment, the memory circuit 15 is a flash memory circuit.

The logic chip 12 includes an automatic rewrite circuit 16 that automatically tests operations for rewriting data, such as the erasing (deleting) of data from the memory circuit 15 and the programming (writing) of data to the memory circuit 15. The rewrite operation testing of the memory circuit 15 is performed when the logic circuit 14 is tested. That is, the rewrite operation testing is performed independently from and parallel to the testing of the logic circuit 14.

The three operations of erasing (deleting), programming (writing), and reading are performed on the memory circuit 15. Among the three operations, it is well known that the speed of the erasing operation and the speed of the programming operation are slow. Accordingly, in the present embodiment, the testing of the data rewrite operation in which data is erased from and programmed in the memory circuit 15 is performed parallel to the testing of the logic circuit. Thus, most of the data rewrite testing for the memory circuit 15 is performed parallel to the testing of the logic circuit 14. This shortens the test period.

The operation speed for reading data from the memory circuit 15 is relatively fast. Thus, even if operation testing is performed separately in the memory circuit 15 and the logic circuit 14, this would not delay the testing of the MCP semiconductor device 11 as a whole. Further, a determination circuit, which is required for a typical built-in automatic testing circuit, is eliminated from the automatic rewrite circuit 16 that is mounted on the logic chip 12 even though such a determination circuit would not cause delays in testing of the memory circuit 15. This reduces the circuit scale of the automatic rewrite circuit 16 and satisfies the demand for a more compact semiconductor device.

Figure 5:
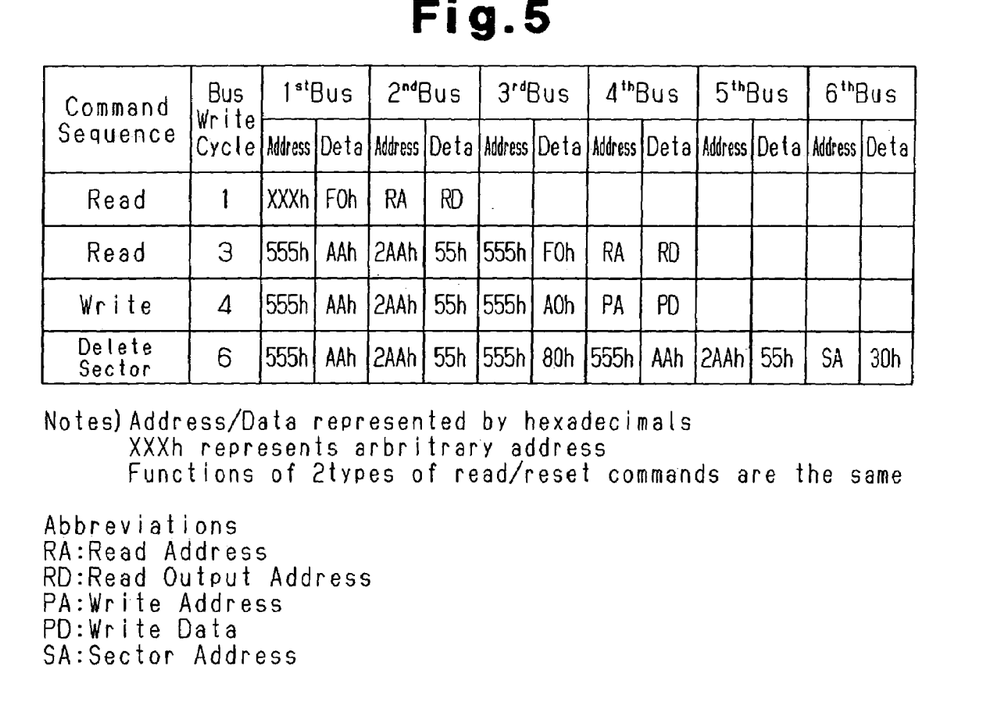
FIG. 5 is a table showing commands for rewriting data to and reading data from a flash memory.
Figure 6:
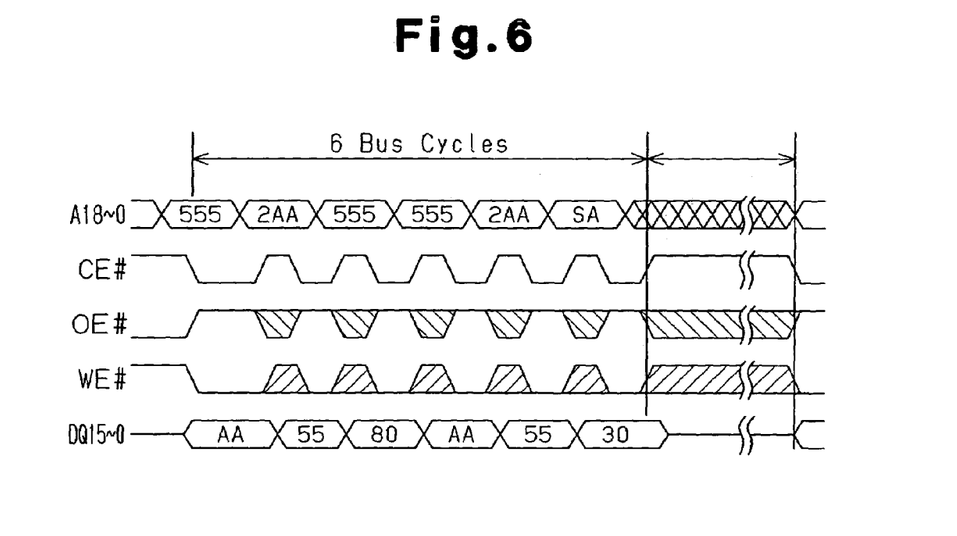
FIG. 6 is a timing chart showing an erase operation for the flash memory.
Figure 7:
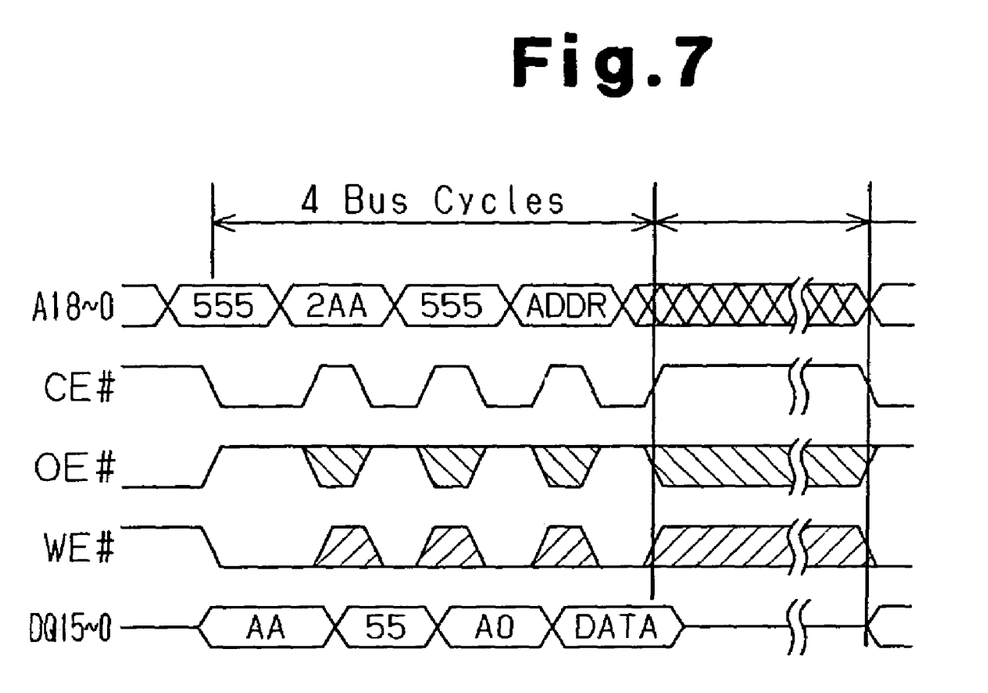
FIG. 7 is a timing chart showing a program operation for the flash memory.

FIGS. 5 to 7 show a typical command system and the process timing of a flash memory. Referring to FIG. 5, before the flash memory performs deleting, rewriting, or reading, the flash memory is provided with a few cycles of commands configured by predetermined addresses and data.

An example of a delete operation will now be discussed with reference to FIG. 6. In six bus cycles, delete command addresses and command data are sequentially input. Then, the delete operation is started in accordance with the delete address (sector address) and data 30h (refer to FIG. 5) input in the sixth bus cycle. The delete command addresses and command data serve as a delete signal.

In the same manner, an example of a write operation will now be described with reference to FIG. 7. In four bus cycles, write command addresses and command data for four bus cycles are sequentially input. Then, the write operation is started in accordance with the write address and write data input in the fourth bus cycle. The write command addresses and command data serve as a write signal.

The automatic rewrite circuit 16 is provided with a test start command SS and an operation mode setting signal AM (e.g., signal having several bits) from an external device, or logic tester 17, which also tests the logic circuit 14. In response to the test start command SS and the operation mode setting signal AM, the automatic rewrite circuit 16 starts testing the data rewrite operation. The operation mode setting signal AM includes information related with operation modes, such as the program operation and the erase operation, and information related with data patterns (e.g., full board program and checkerboard program) during program operation. When the automatic rewrite circuit 16 ends data rewriting, the tester 17 provides the memory chip 13 with a data read command RS. In response to the data read command RS, the tester 17 retrieves data RDT, which is read from the memory circuit 15. A determination circuit, which is incorporated in the tester 17, determines the results of the test from the data RDT.

In FIG. 1, a selector 18 (switch circuit) in the logic chip 12 switches between accessing by the tester 17, accessing of the memory chip 13 (memory circuit 15) by the automatic rewrite circuit 16, and normal accessing of the logic circuit 14. Since the automatic rewrite circuit 16 and the selector 18 are both incorporated in the logic chip 12, the configuration of the memory chip 13 does not have to be changed.

Figure 2:
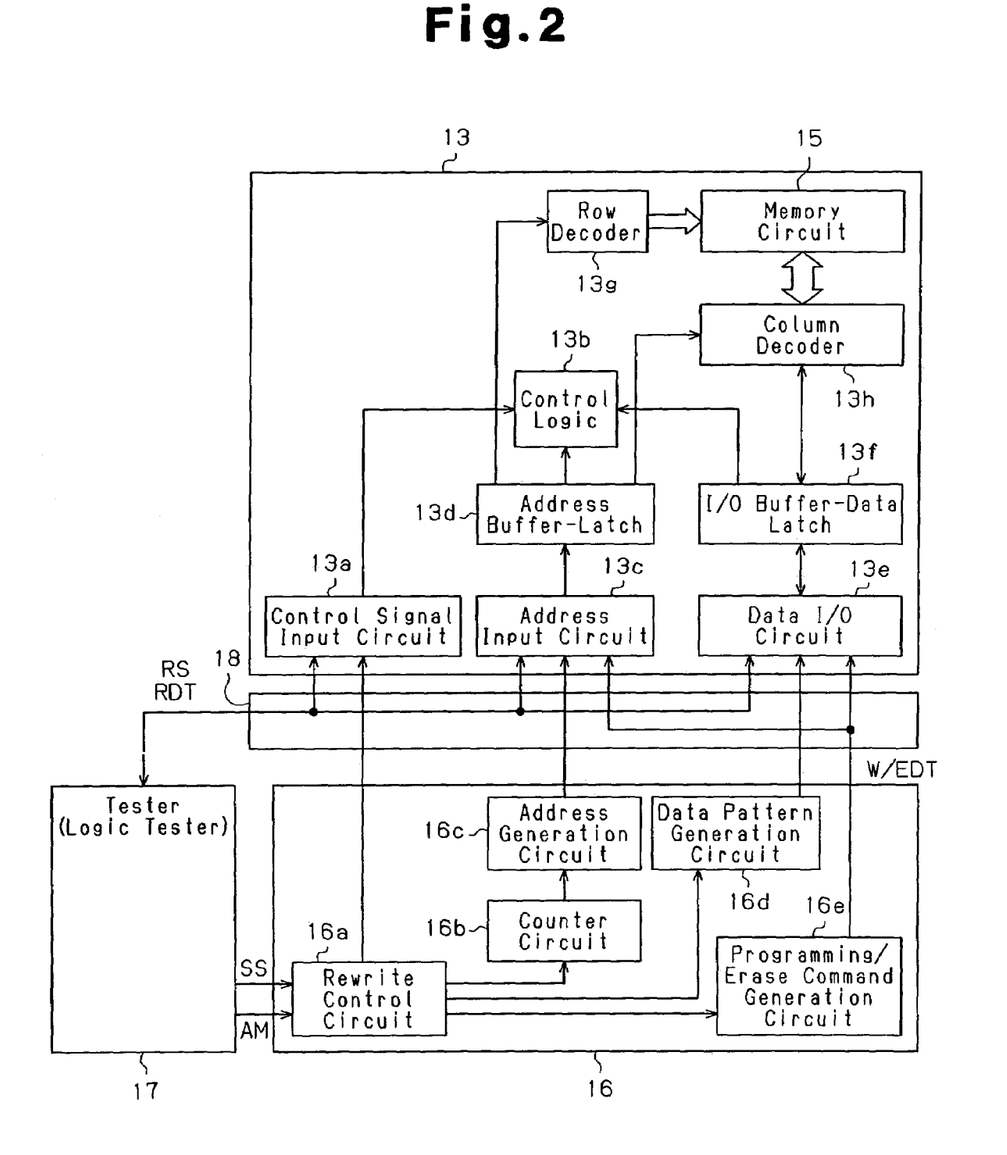
FIG. 2 is a detailed block diagram of the semiconductor device of the first embodiment.

The automatic rewrite circuit 16 will now be described with reference to FIG. 2.

The automatic rewrite circuit 16 includes a rewrite control circuit 16a, a counter circuit 16b, an address generation circuit 16c, a data pattern generation circuit 16d, and a programming/erase command generation circuit 16e. The rewrite control circuit 16a generates a rewrite control signal for every predetermined cycle in accordance with the test command signal SS, which is provided from the tester 17. The counter circuit 16b performs a count operation in synchronism with the rewrite control signal. The address generation circuit 16c generates a rewrite address in accordance with a count value of the counter circuit 16b. The data pattern generation circuit 16d generates rewrite data in accordance with the operation mode setting signal AM. The programming/erase command generation circuit 16e generates a programming/erase command in accordance with the operation mode setting signal AM.

The rewrite control signal, the rewrite address, the rewrite data, and the programming/erase command are provided to the memory chip 13 via the selector 18. In the memory chip 13, data is rewritten to the memory circuit 15 according to these signals and commands in the modes described below.

First, the rewrite control signal, for example, a chip enable signal CE#, an output enable signal OE#, or a write enable signal WE#, is provided to the control logic 13b via a control signal input circuit 13a.

The programming/erase command generation circuit 16e generates the programming/erase command as two signals, a command address signal and a command data signal. The command address signal is provided to an address buffer-latch 13d via an address input circuit 13c of the memory chip 13, latched by the address buffer-latch 13d, and then provided to the control logic 13b. The command data signal is provided to an input/output buffer-data latch 13f via a data input/output circuit 13e of the memory chip 13 and then provided to the control logic 13b.

Subsequently, the address generation circuit 16c provides the generated rewrite address to the control logic 13b, a row decoder 13g, and a column decoder 13h via the address input circuit 13c and the address buffer-latch 13d. The data pattern generation circuit 16d provides the generated rewrite data to the control logic 13b and the column decoder 13h via the data input/output circuit 13e and the input/output buffer-data latch 13f.

The control logic 13b determines whether to enter the programming operation or the erase operation based on the programming/erase command, or the combination of the command address and the command data signal, and sets the operation mode in accordance with the determination.

In accordance with the programming or erase operation mode, the rewrite control circuit 16a generates the rewrite control signal for the next rewrite address after the time required for rewriting data to the memory circuit 15 elapses. The control logic 13b is electrically connected to a voltage adjustment circuit (not shown). The voltage adjustment circuit adjusts the voltage applied to the memory circuit 15 in accordance with a control signal provided from the control logic 13b.

After data is rewritten to the entire memory cell, the rewrite control circuit 16a does not automatically output the rewrite control signal. Thus, the output timing of the rewrite control signal is changed in accordance with the memory capacity of the memory circuit 15. Further, the address generation circuit 16c changes the method for generating an address in accordance with the operation mode setting signal AM. For example, when erasing a sector, an address incremented by the number of addresses corresponding to a sector unit is generated. When writing data in a checkerboard pattern, an address is incremented by two. Subsequently, in the modes described below, the rewritten test data is read and a determination is made based on the test result.

The tester 17 outputs a read control signal and a read address as the read command RS.

The read control signal is provided to the control logic 13b via the control signal input circuit 13a of the memory chip 13. The read address is provided to the address buffer-latch 13d via the address input circuit 13c of the memory chip 13 and latched by the address buffer-latch 13d. The read address is then provided to the control logic 13b, the row decoder 13g, and the column decoder 13h.

Thus, the memory circuit 15 reads test data from a memory cell that corresponds to the read address provided to the decoders 13g and 13h. The read test data is provided to the input/output buffer-data latch 13f via the column decoder 13h, latched by the input/output buffer-data latch 13f, and output to the memory chip 13 via the data input/output circuit 13e. The test data is retrieved by the tester 17 via the selector 18.

The tester 17 determines whether the memory chip 13 is functioning properly based on the test data. More specifically, the tester 17 includes an expected data pattern generation circuit for generating data used to determine proper functioning in synchronism with the read control signal. The proper functioning determination data is generated through a measurement program, which is generated in accordance with the data written to the memory circuit 15. The tester 17 compares the read test data with the proper functioning determination data to determine whether or not the memory chip 13 is functioning properly.

An example of the procedures for testing the semiconductor device will now be discussed with reference to FIG. 3.

In step S1, the tester 17 outputs the test start command SS and the operation mode setting signal AM to the automatic rewrite circuit 16. In steps S2 to S4, the tester 17 executes a series of tests on the logic circuit 14. In response to the test start command SS provided to the automatic rewrite circuit 16 in step S1, the automatic rewrite circuit 16 starts to automatically rewrite data to the memory circuit 15 in step S5. In step S6, the automatic rewrite circuit 16 ends the rewriting of data to the memory circuit 15. When the tester 17 completes the nth test of the logic circuit 14, the tester 17 proceeds to step S7 and starts reading the test data rewritten to the memory circuit 15. The read test data is compared with the proper functioning determination data to determine whether the memory circuit 15 is functioning properly.

Afterwards, the tester 17 repetitively performs the processes of steps S1 to S7 until completing the testing of the logic circuit 14 or the testing of the memory circuit 15 (step S8).

The advantages of the first embodiment will now be described.

(1) The logic chip 12 of the semiconductor device includes the automatic rewrite circuit 16, which automatically rewrites data to the memory circuit 15. Thus, the rewriting of data to the memory circuit 15 is performed independently from and in parallel to the testing of the logic circuit 14. As a result, a semiconductor package that has a simple configuration and includes a plurality of semiconductor chips is tested efficiently, and the time for testing the semiconductor device is reduced. Further, the scale of the automatic rewrite circuit 16 is small. This does not contradict with the demand for a more compact semiconductor device.

(2) The automatic rewrite circuit 16 is incorporated in the logic chip 12. Thus, in the semiconductor device, the circuit configuration of the memory chip 13 does not have to be changed even when the automatic rewrite circuit 16 is employed.

(3) The function of programming data to the memory circuit 15 or the function of erasing data from the memory circuit 15 may be eliminated from the automatic rewrite circuit 16. This would enable further reduction of the scale of the automatic rewrite circuit 16.

Figure 4:
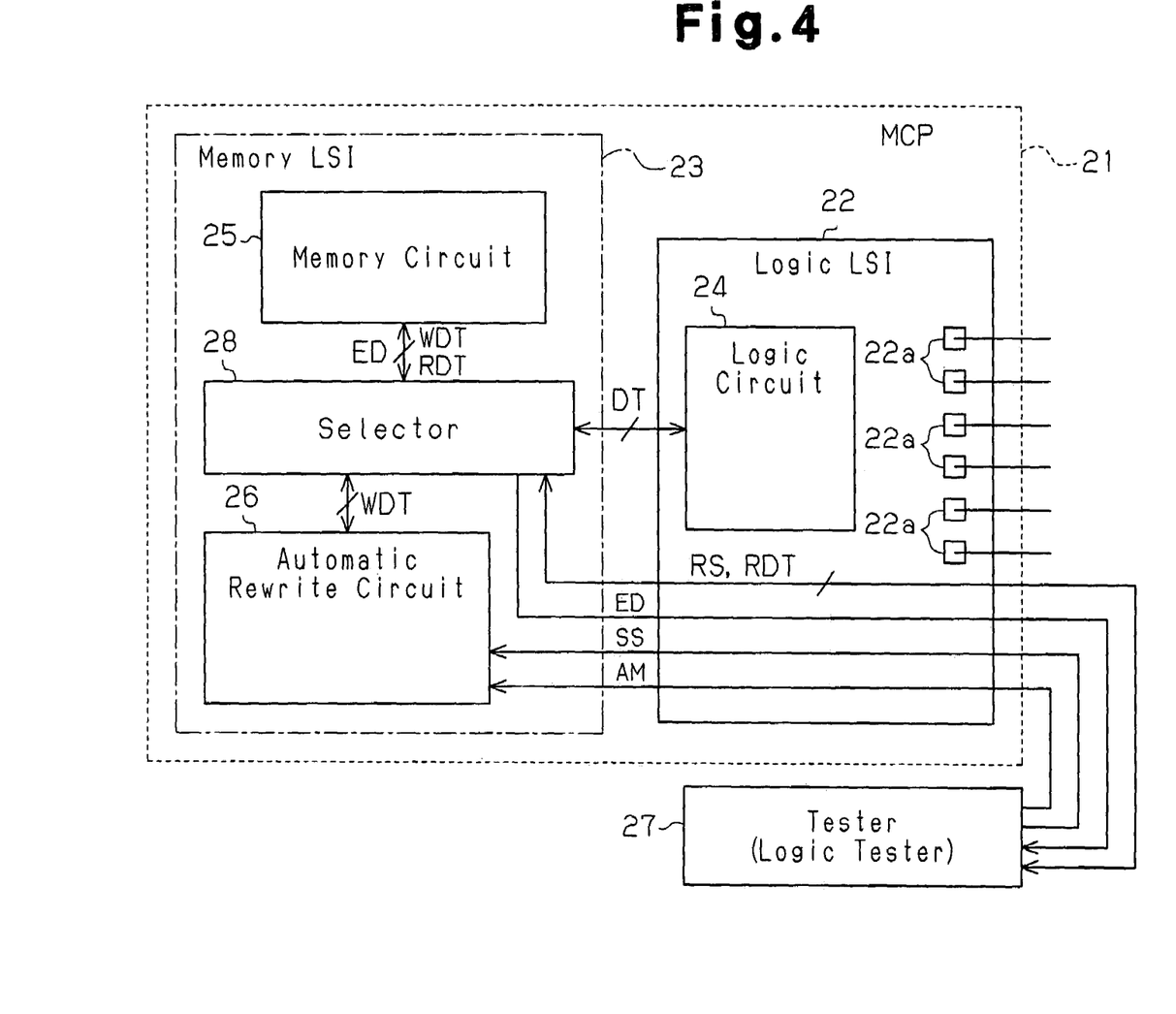
FIG. 4 is a schematic block diagram showing a semiconductor device according to a second embodiment of the present invention.

A semiconductor device 21 and a method for testing the semiconductor device 21 according to a second embodiment of the present invention will now be described with reference to FIG. 4.

The semiconductor device 21 is an MCP including a plurality of packaged semiconductor chips. The semiconductor chips mounted on the semiconductor device 11 includes a logic chip 22 (logic LSI), which is provided with a function for processing data, and a memory chip 23 (memory LSI), which stores the data processed by the logic chip 12 or data to be processed by the logic chip 12.

The logic chip 22 includes a logic circuit 24, such as a digital signal processor (DSP). The logic circuit 14 processes data provided through terminals 22a of the logic chip 22. The processed data DT is normally provided to the memory chip 23 and written to a memory circuit 25, which is incorporated in the memory chip 23. Conversely, data DT that is processed by the logic circuit 14 may be pre-written to the memory circuit 15. In such a case, the data processed by the logic circuit 24 is output to external devices via the terminals 22a. The memory circuit 25 is, for example, a flash memory circuit.

In the second embodiment, the memory chip 23 includes an automatic rewrite circuit 26 that automatically rewrites data to the memory circuit 25. Accordingly, a selector 28 in the memory chip 23 switches between accessing by a tester 27, accessing of the memory circuit 25 by the automatic rewrite circuit 26, and normal accessing of the logic circuit 14.

When the memory chip 23 has such a configuration, the rewriting of data to the memory circuit 25 may also be performed during the time the logic circuit 24 is tested. That is, the rewriting of data to the memory circuit 25 may be performed in parallel to and independently from the testing of the logic circuit 24. Thus, the semiconductor device is tested efficiently. This reduces the entire testing time.

The automatic rewrite circuit 26 starts the rewriting of data when receiving a test start command SS and an operation mode setting signal AM from an external device, or the logic tester 27, which also tests the logic circuit 24. The automatic rewrite circuit 26 differs from the first embodiment in that the rewriting of data to the memory circuit 25 by the automatic rewrite circuit 26 ends when the memory chip 23 outputs a completion signal ED to the tester 27. When the tester 27 recognizes the completion of data rewriting by the automatic rewrite circuit 26, the tester 27 accesses the memory chip 23, reads and retrieves the test data stored in the memory circuit 25, and determines whether the test data is proper with an incorporated determination circuit.

The configuration and operation of the automatic rewrite circuit 26 is substantially the same as in the first embodiment. However, the second embodiment differs from the first embodiment in that the control logic 13b outputs the rewrite completion signal ED to the tester 27 when the final rewrite address is input and the rewriting of that data is completed.

Figure 3:
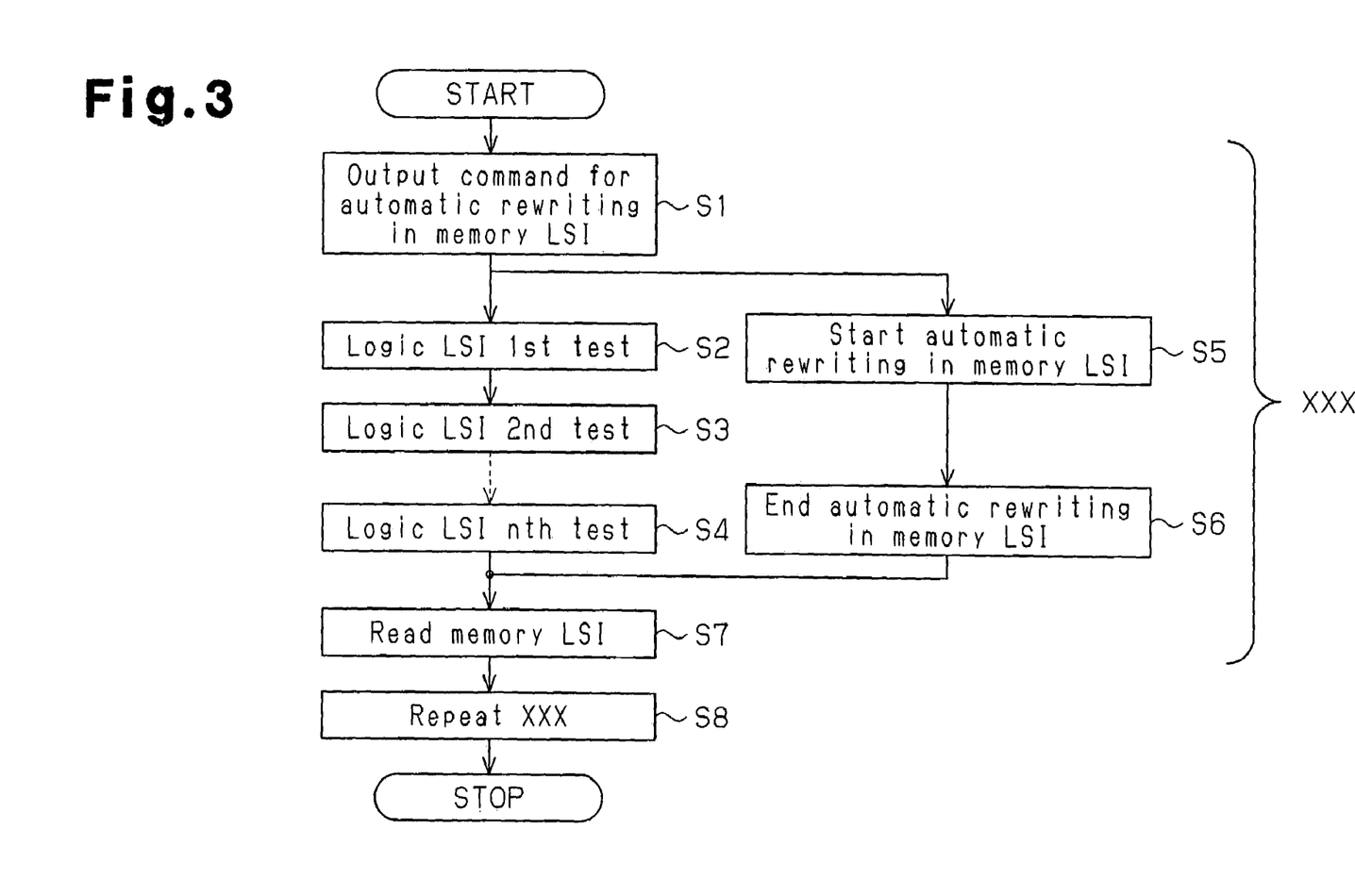
FIG. 3 is a flowchart showing the procedures for testing the semiconductor device of the first embodiment.

The procedures for testing the semiconductor device are as shown in the flowchart of FIG. 3.

Accordingly, the second embodiment has advantages (1) and (3) of the first embodiment. The second embodiment also has an advantage similar to advantage (2) of the first embodiment.

(2a) The automatic rewrite circuit 26 is incorporated in the memory chip 23. Thus, in the semiconductor device, the circuit configuration of the logic chip 22 does not have to be changed even when the automatic rewrite circuit 26 is employed.

It should be apparent to those skilled in the art that the present invention may be embodied in many other specific forms without departing from the spirit or scope of the invention. Particularly, it should be understood that the present invention may be embodied in the following forms.

In the above embodiments, the memory circuits 15 and 25 are not limited to flash memories and may be an electrically rewriteable non-volatile memory, such as an EEPROM.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a plurality of semiconductor chips mounted in a single package, the semiconductor chips including a logic chip, provided with a logic circuit for processing predetermined data, and a memory chip, provided with an electrically rewriteable non-volatile memory circuit for storing data that is processed by or that is to be processed by the logic circuit,
   wherein the logic chip is further provided with:
   an automatic rewrite circuit for automatically writing test data to the non-volatile memory circuit in accordance with a command signal from an external device; and
   a switch circuit for switching between accessing of the non-volatile memory circuit by the automatic rewrite circuit and accessing of the non-volatile memory circuit by the logic circuit.

2. The semiconductor device according to claim 1, wherein the automatic rewrite circuit outputs a delete signal for deleting the test data written to the non-volatile memory circuit.

3. A semiconductor device comprising:
   a plurality of semiconductor chips mounted in a single package, the semiconductor chips including a logic chip, provided with a logic circuit for processing predetermined data, and a memory chip, provided with an electrically rewriteable non-volatile memory circuit for storing data that is processed by or that is to be processed by the logic circuit,
   wherein the memory chip is further provided with:
   an automatic rewrite circuit for automatically writing test data to the non-volatile memory circuit in accordance with a command signal from an external device; and
   a switch circuit for switching between accessing of the non-volatile memory circuit by the automatic rewrite circuit and accessing of the non-volatile memory circuit by the logic circuit.

4. The semiconductor device according to claim 3, wherein the automatic rewrite circuit outputs a delete signal for deleting the test data written to the non-volatile memory circuit.

5. A method for testing a semiconductor device including a plurality of semiconductor chips mounted in a single package, the semiconductor chips including a logic chip, provided with a logic circuit for processing predetermined data, and a memory chip, provided with an electrically rewriteable non-volatile memory circuit for storing data that is processed by or that is to be processed by the logic circuit, the semiconductor device including an automatic rewrite circuit, for automatically writing test data to the non-volatile memory circuit in accordance with a command signal from an external device, and a switch circuit, for switching between accessing of the non-volatile memory circuit by the automatic rewrite circuit and accessing of the non-volatile memory circuit by the logic circuit, the method comprising:
   automatically writing test data to the non-volatile memory circuit with the automatic rewrite circuit; and
   testing the operation of the logic circuit with the external device, with said testing being performed in parallel to said automatically writing test data to the non-volatile memory circuit.

* * * * *

UNITED STATES PATENT AND TRADEMARK OFFICE
CERTIFICATE OF CORRECTION

| | | |
|---|---|---|
| PATENT NO. | : 7,451,368 B2 | Page 1 of 1 |
| APPLICATION NO. | : 10/951398 | |
| DATED | : November 11, 2008 | |
| INVENTOR(S) | : Sigenori Sibata et al. | |

It is certified that error appears in the above-identified patent and that said Letters Patent is hereby corrected as shown below:

Title page Item [75], inventor Takayuki Suzuki address should read Gifu-shi, Japan.

Signed and Sealed this

Tenth Day of March, 2009

JOHN DOLL
*Acting Director of the United States Patent and Trademark Office*